(12) United States Patent
Zheng et al.

(10) Patent No.: US 10,125,250 B2
(45) Date of Patent: Nov. 13, 2018

(54) OPTICAL COMPENSATION FILM HAVING REVERSED WAVELENGTH DISPERSION

(71) Applicant: Akron Polymer Systems, Inc., Akron, OH (US)

(72) Inventors: Xiaoliang Zheng, Hudson, OH (US); Alan Phillips, Kingsport, TN (US); Bin Wang, Kingsport, TN (US); Peiyao Wang, Akron, OH (US); Lang Hu, Akron, OH (US); Wentao Li, Kingsport, TN (US); Liu Deng, Kingsport, TN (US); Thauming Kuo, Kingsport, TN (US); Dong Zhang, Uniontown, OH (US); Frank Harris, Boca Raton, FL (US); Ted Germroth, Kingsport, TN (US)

(73) Assignee: Akron Polymer Systems, Inc., Akron, OH (US)

( * ) Notice: Subject to any disclaimer, the term of this patent is extended or adjusted under 35 U.S.C. 154(b) by 0 days.

(21) Appl. No.: 15/674,705

(22) Filed: Aug. 11, 2017

(65) Prior Publication Data

US 2018/0072882 A1 Mar. 15, 2018

Related U.S. Application Data

(60) Provisional application No. 62/374,247, filed on Aug. 12, 2016, provisional application No. 62/476,959, filed on Mar. 27, 2017.

(51) Int. Cl.
*G02B 5/30* (2006.01)
*C08L 25/18* (2006.01)
(Continued)

(52) U.S. Cl.
CPC ............. *C08L 25/18* (2013.01); *C08F 112/14* (2013.01); *C08G 73/1007* (2013.01);
(Continued)

(58) Field of Classification Search
CPC .............. G02B 5/3083; G02F 1/13363; G02F 1/133638; C08L 25/18; C08F 112/14; C08G 73/1007; C08G 73/1067
(Continued)

(56) References Cited

U.S. PATENT DOCUMENTS 3,573,253 A  3/1971  Gray
6,049,419 A *  4/2000  Wheatley .......... B32B 17/10018
                                                  359/359
(Continued)

FOREIGN PATENT DOCUMENTS

CN  105037602 A  11/2015
EP  2060937 A1  5/2009
(Continued)

OTHER PUBLICATIONS

ISR and Written Opinion from PCT/US2017/046498 dated Nov. 21, 2017.
(Continued)

*Primary Examiner* — Ricky D Shafer
(74) *Attorney, Agent, or Firm* — Calfee, Halter & Griswold LLP

(57) ABSTRACT

Disclosed is an optical compensation film made of a solution cast of a polymer blend comprising a nitrated styrenic fluoropolymer and a polyimide. The compensation film is a positive-C plate having reversed wavelength dispersion that is capable of providing an achromatic (or broadband) retardation compensation. The optical film of the invention can be used in an optical device such as liquid crystal display (LCD) or organic light emitting diode (OLED) display.

24 Claims, 1 Drawing Sheet

(51) Int. Cl.
  *G02B 5/20* (2006.01)
  *C08F 112/14* (2006.01)
  *C08G 73/10* (2006.01)
  *G02F 1/13363* (2006.01)
  *H01L 51/52* (2006.01)

(52) U.S. Cl.
  CPC ........... *C08G 73/1067* (2013.01); *G02B 5/20* (2013.01); *G02B 5/3083* (2013.01); *G02F 1/13363* (2013.01); *H01L 51/5281* (2013.01); *C08L 2203/16* (2013.01); *C08L 2203/20* (2013.01); *G02F 2001/133638* (2013.01)

(58) Field of Classification Search
  USPC ................ 359/489.02, 489.07; 349/117, 118
  See application file for complete search history.

(56) References Cited

U.S. PATENT DOCUMENTS

| | | |
|---|---|---|
| 6,069,278 A | 5/2000 | Chuang |
| 7,737,308 B1 | 6/2010 | Straessler |
| 7,848,020 B2 | 12/2010 | Hendrix et al. |
| 8,304,079 B2 | 11/2012 | Germroth et al. |
| 8,545,970 B2 | 10/2013 | Doi et al. |
| 8,802,238 B2 | 8/2014 | Zheng et al. |
| 8,889,043 B2 | 11/2014 | Wang et al. |
| 9,096,719 B2 | 8/2015 | Zhang et al. |
| 9,234,987 B2 | 1/2016 | Wang et al. |
| 2003/0212243 A1 | 11/2003 | Hergenrother et al. |
| 2006/0141219 A1* | 6/2006 | Benson, Jr. ............. B29C 55/04 428/156 |
| 2008/0239491 A1 | 10/2008 | Zheng et al. |
| 2008/0241565 A1 | 10/2008 | Germroth et al. |
| 2011/0076487 A1 | 3/2011 | Zheng et al. |
| 2012/0113338 A1 | 5/2012 | Saigusa et al. |
| 2013/0279126 A1 | 10/2013 | Chen et al. |
| 2014/0205822 A1 | 7/2014 | Wang et al. |
| 2016/0215132 A1* | 7/2016 | Zheng ...................... G02B 1/04 |
| 2018/0044444 A1* | 2/2018 | Zhang ...................... C08F 8/20 |
| 2018/0044447 A1* | 2/2018 | Hu ........................... C08F 12/26 |
| 2018/0052271 A1* | 2/2018 | Wang ...................... B32B 27/08 |

FOREIGN PATENT DOCUMENTS

| | | |
|---|---|---|
| JP | 2010077318 A | 4/2010 |
| JP | 2011102868 A | 5/2011 |
| KR | 10-2015-0037443 A | 4/2015 |
| WO | 2016118873 A1 | 7/2016 |
| WO | 2018031880 A1 | 2/2018 |
| WO | 2018031886 A1 | 2/2018 |
| WO | 2018031909 A1 | 2/2018 |

OTHER PUBLICATIONS

ISR and Written Opinion from PCT/US2017/046548 dated Nov. 22, 2017.
ISR and Written Opinion from PCT/US2017/046432 dated Nov. 21, 2017.
ISR and Written Opinion from PCT/US2017/046490 dated Nov. 20, 2017.

* cited by examiner

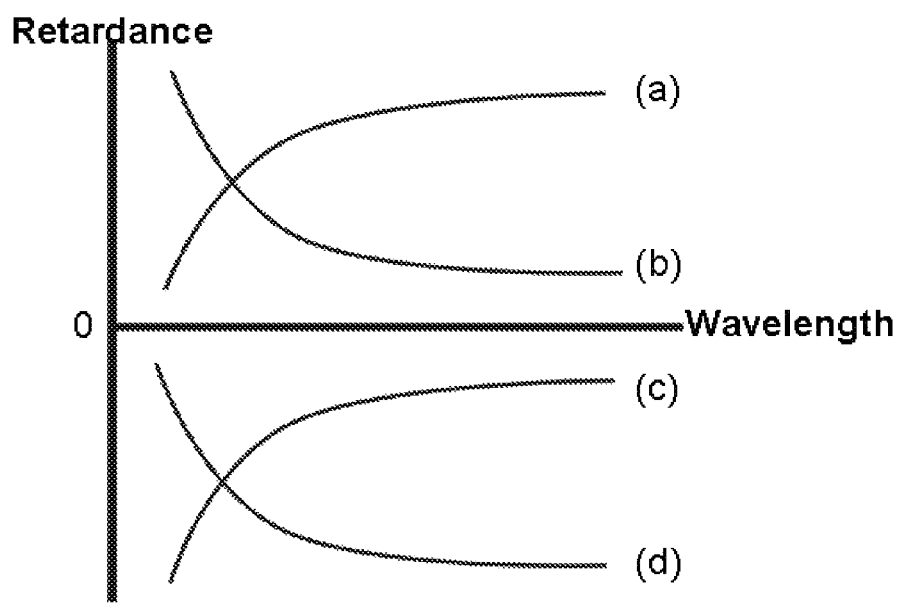

OPTICAL COMPENSATION FILM HAVING REVERSED WAVELENGTH DISPERSION

CROSS-REFERENCE TO RELATED APPLICATIONS

This application claims priority to and the benefit of U.S. Provisional Patent Applications No. 62/476,959, filed Mar. 27, 2017, and No. 62/374,247, filed Aug. 12, 2016, the entire content of which is incorporated by reference herein.

FIELD OF THE INVENTION

This invention pertains to a wide-view optical compensation film having positive out-of-plane retardation. More specifically, this invention relates to a positive-C plate having reversed wavelength dispersion that is capable of providing an achromatic (or broadband) retardation compensation. The optical film of the invention may be used in an optical device such as liquid crystal display (LCD), organic light emitting diode (OLED) display, 3D display, optical switch, or waveguide where a controlled light management is desirable.

BACKGROUND OF THE INVENTION

It is known in the art of optical compensation that the phase retardation of light varies according to wavelength, causing color shift. This wavelength dependence (or dispersion) characteristic of the compensation film may be taken into account when designing an optical device so that color shift is reduced. Wavelength dispersion curves are defined as "normal (or "proper") or "reversed" with respect to the compensation film having positive or negative retardance (or retardation). A compensation film with positive retardance (positive A- or C-plate) may have a normal curve in which the value of phase retardation is increasingly positive toward shorter wavelengths or a reversed curve in which the value of phase retardation is decreasingly positive toward shorter wavelengths. A compensation film with negative retardance (negative A- or C-plate) may have a normal curve in which the value of phase retardation is increasingly negative toward shorter wavelengths or a reversed curve in which the value of phase retardation is decreasingly negative toward shorter wavelengths. Exemplary shapes of these curves are depicted in FIG. 1.

Wave plates are customarily named as follows in accordance with their refractive index profiles:
positive C-plate: $n_x = n_y < n_z$; negative C-plate: $n_x = n_y > n_z$
positive A-plate: $n_x > n_y = n_z$; negative A-plate: $n_x < n_y = n_z$
wherein, $n_x$ and $n_y$ represent in-plane refractive indices, and $n_z$ the thickness refractive index.
C-plate and A-plate wave plates are uniaxial birefringent plates. A wave plate can also be biaxial birefringent, where $n_x$, $n_y$, and $n_z$ are all not equal; such plates are customarily called biaxial films.

An A-plate having in-plane retardation ($R_e$) equal to a quarter of the wavelength ($\lambda/4$) is called quarter wave plate (QWP). Likewise, an A-plate having $R_e$ equal to half of the wavelength ($\lambda/2$) is called half wave plate (HWP). An ideal achromatic QWP would be able to retard an incident polarized light by $\lambda/4$ at every wavelength. In order to achieve this ideal achromatic QWP, the wavelength dispersion of the QWP has to be reversed and must satisfy the following equations:

$$R_e(450)/R_e(550)=0.818 \text{ and } R_e(650)/R_e(550)=1.182,$$

wherein $R_e(450)$, $R_e(550)$, and $R_e(650)$ are in-plane retardations at the light wavelengths of 450 nm, 550 nm, and 650 nm respectively. An achromatic (or broadband) wave plate is highly desirable since it can direct the light in the same manner at each wavelength to yield the optimal viewing quality. A common wave plate, however, exhibits a normal dispersion curve, which is not suitable for broadband wave plate application.

Similar to positive A-plates, positive C-plates having reversed wavelength dispersion curves are also desirable for broadband applications. Such C-plates can satisfy the following equations:

$$R_{th}(450)/R_{th}(550)=0.818 \text{ and } R_{th}(650)/R_{th}(550)=1.182,$$

wherein $R_{th}(450)$, $R_{th}(550)$, and $R_{th}(650)$ are out-of-plane retardations at the light wavelengths of 450 nm, 550 nm, and 650 nm respectively. There exists a need for a positive C-plate having reversed wavelength dispersion characteristics with respect to out-of-plane retardation.

A-plates are commonly used in liquid crystal displays (LCDs) as compensation films to improve the viewing angles. They can also be used in an OLED (organic light emitting diode) display device. For example, a QWP can be being used with a linear polarizer to provide a circular polarizer in an OLED device to reduce the ambient light reflected by OLED for improved viewing quality. These applications typically utilize the in-plane retardation provided by the A-plate for in-plane phase-shift compensation. For example, A-plate combining with C-plate is particularly useful in reducing light leakage of the crossed polarizers at oblique viewing angles. The A-plate, however, also exhibits a negative out-of-plane retardation $R_{th}$, which is defined by the equation $R_{th}=[n_z-(n_x+n_y)/2] \times d$ with a value of $|R_e/2|$ arising from its orientation. This characteristic can be beneficial when a negative $R_{th}$ is desirable in an optical device. For example, in a vertically aligned (VA) mode LCD, the liquid crystal molecules in the LC cell are aligned in a homeotropic manner, which results in positive retardation. An A-plate, thus, can provide an out-of-plane compensation in addition to in-plane compensation in VA-LCD. In other devices, such as in-plane switch (IPS) mode LCD and OLED display, however, the $R_{th}$ exhibited in the A-plate is not desirable since it can cause phase shift in off-axis light and lead to light leakage. Thus, there exists an additional need in the art to provide a positive in-plane retarder having reduced out-of-plane retardation for improved viewing angle and contrast ratio of the display. The reduction of the out-of-plane retardation can be achieved by using a positive-C plate in combination with the A-plate. Further, it is most desirable that the positive-C plate has a reversed wavelength dispersion characteristic in order to achieve the achromatic compensation.

SUMMARY OF THE INVENTION

Embodiments disclosed herein are directed to an optical compensation film, which is made by solution casting of a polymer blend comprising:
(a) a nitrated styrenic fluoropolymer and
(b) a polyimide,
wherein said optical compensation film has positive out-of-plane retardations that satisfy the relations of $0.7 < R(450)/R(550) < 1$ and $1 < R(650)/R(550) < 1.25$, wherein $R(450)$, $R(550)$, and $R(650)$ are out-of-plane retardations at the light wavelengths of 450 nm, 550 nm, and 650 nm respectively, and wherein the nitrated styrenic fluoropolymer has a styrenic moiety of:

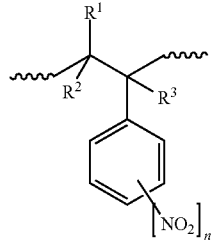

wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, and wherein n is an integer from 1 to 5 representing the number of the nitro group(s) on the styrenic ring.

In another embodiment, the nitrated styrenic fluoropolymer (a) is present from about 60% to about 90% or from about 70% to about 80%, and the polyimide (b) is from about 10% to about 40% or from about 20% to about 30%, based on the total weight of (a) and (b).

In a further embodiment, this invention provides a multilayer optical film comprising the optical compensation film of the present invention and an A-plate having a refractive index profile of $n_x > n_y = n_z$, wherein $n_x$ and $n_y$ represent in-plane refractive indices, and $n_z$ the thickness refractive index.

In certain other embodiments, a polymer resin is provided. The resin has a moiety of:

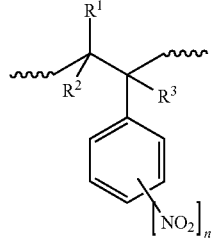

wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, and wherein n is an integer from 1 to 5 representing the number of the nitro group(s) on the styrenic ring. In certain embodiments, the polymer resin comprises a mixture or copolymer of a styrenic fluoropolymer (above) and a polyimide.

In other embodiments of the present invention, a polymer solution is provided. The polymer solution comprises a solvent and a polymer having a styrenic moiety of:

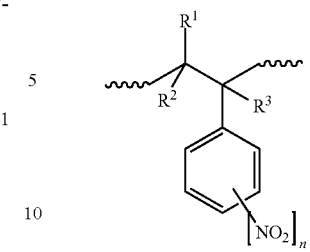

wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, and wherein n is an integer from 1 to 5 representing the number of the nitro group(s) on the styrenic ring. In certain embodiments, the polymer in the polymer solution comprises a mixture or copolymer of a styrenic fluoropolymer (above) and a polyimide.

BRIEF DESCRIPTION OF THE DRAWINGS

FIG. 1 is a graph depicting the shapes of exemplary wavelength dispersion curves for: (a) a reversed curve for positive retardation, (b) a normal curve for positive retardation, (c) a normal curve for negative retardation and (d) a reversed curve for negative retardation.

DETAIL DESCRIPTION OF THE INVENTION

Retardation (R) of a wave plate is defined by the equation $R = \Delta n \times d$, wherein $\Delta n$ is the birefringence and d is the thickness of the wave plate. Birefringence is classified into in-plane birefringence $\Delta n_{in} = n_x - n_y$, and out-of-plane birefringence $\Delta n_{th} = n_z - (n_x + n_y)/2$. In-plane retardation is represented by the equation $R_e = (n_x - n_y) \times d$ and out-of-plane retardation by $R_{th} = [n_z - (n_x + n_y)/2] \times d$.

Birefringence ($\Delta n$) of a wave plate may be measured by determining the birefringence of a wave plate over a wavelength range of about 400 nm to about 800 nm at different increments. Alternatively, birefringence may be measured at a specific light wavelength. Throughout this description, when a birefringence or retardation relation is given without specifying a wavelength, it is meant to be true throughout the wavelength range of about 400 nm to about 800 nm.

In one embodiment of the present invention, there is provided an optical compensation film, which is made by solution casting of a polymer blend comprising:
(a) a nitrated styrenic fluoropolymer and
(b) a polyimide,
wherein said optical compensation film has positive out-of-plane retardations that satisfy the relations of $0.7 < R(450)/R(550) < 1$ and $1 < R(650)/R(550) < 1.25$, wherein R(450), R(550), and R(650) are out-of-plane retardations at the light wavelengths of 450 nm, 550 nm, and 650 nm respectively and wherein the nitrated styrenic fluoropolymer has a styrenic moiety of:

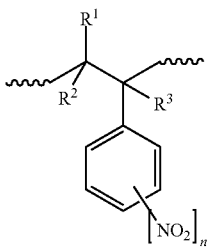

wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, and wherein n is an integer from 1 to 5 representing the number of the nitro group(s) on the styrenic ring.

In another embodiment, the nitrated styrenic fluoropolymer (a) is from about 60% to about 90% or from about 70% to about 80%, and the polyimide (b) is from about 10% to about 40% or from about 20% to about 30%, based on the total weight of (a) and (b).

The optical compensation film in accordance with the present invention has a positive out-of-plane retardation ($R_{th}$) and a reversed out-of-plane wavelength dispersion characteristic, by which the value of phase retardation is decreasingly positive toward shorter wavelengths. This dispersion characteristic is expressed by the ratios of the retardations as measured at the wavelengths of 450 nm, 550 nm, and 650 nm, which satisfy the relations of R(450)/R(550)<1 and R(650)/R(550)>1. The ratio of R(450)/R(550) can be 0.71 to 0.99, 0.72 to 0.98, 0.74 to 0.97, 0.76 to 0.96, 0.78 to 0.95, 0.8 to 0.9, or 0.81 to 0.85. The ratio of R(650)/R(550) can be 1.01 to 1.24, 1.02 to 1.23, 1.03 to 1.22, 1.04 to 1.21, 1.05 to 1.2, or 1.1 to 1.19. In one embodiment, the positive out-of-plane retardations satisfy the relations of 0.8<R(450)/R(550)<0.9 and 1.01<R(650)/R(550)<1.2.

In embodiments disclosed herein, the out-of-plane retardation ($R_{th}$) of the optical compensation film is from about 50 nm to about 200 nm at the wavelength (λ) 550 nm; most preferably from about 100 nm to about 150 nm. Preferably, the film thickness is from about 5 to about 30 micron (μm); most preferably from about 5 micron to about 20 micron.

In certain embodiments, the nitrated styrenic fluoropolymer (a) suitable for this invention comprises the styrenic moiety in the polymer main chain shown below:

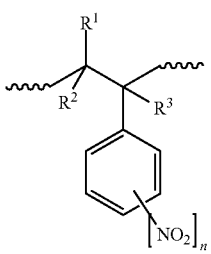

wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, and wherein n is an integer from 1 to 5 representing the number of the nitro group(s) on the styrenic ring.

In the nitrated styrenic fluoropolymer (a), each styrenic moiety may or may not be substituted (but at least one is substituted); the average number of the nitro group(s) on a styrenic moiety in the styrenic fluoropolymer can range from about 0.2 to about 1, which is referred to herein as the degree of substitution (DS) of the nitro groups in the polymer. Desirably, the DS of the nitro group ranges from about 0.5 to about 0.9, from 0.6 to 0.8, or from 0.65 to 0.75.

The nitrated styrenic fluoropolymer (a) may be prepared by nitration of a styrenic fluoropolymer, which may be a homopolymer or a copolymer. Examples of the homopolymer include, but are not limited to, poly(α,β,β-trifluorostyrene), poly(α,β-difluorostyrene), poly(β,β-difluorostyrene), poly(α-fluorostyrene), or poly(β-fluorostyrene). In one embodiment the styrenic fluoropolymer is poly(α,β,β-trifluorostyrene). The copolymer may be prepared by copolymerization of one or more of the fluorine-containing monomers with one or more ethylenically unsaturated monomers. Examples of such fluorine-containing monomers include, but are not limited to, α,β,β-trifluorostyrene, α,β-difluorostyrene, β,β-difluorostyrene, α-fluorostyrene, β-fluorostyrene, and combinations thereof.

In one embodiment, the styrenic fluoropolymer is a copolymer of α,β,β-trifluorostyrene with one or more ethylenically unsaturated monomers selected from the group comprising styrene, methyl acrylate, methyl methacrylate, butyl acrylate, butyl methacrylate, 2-ethylhexyl acrylate, acrylic acid, methacrylic acid, α-methyl styrene, 4-methylstyrene, vinyl biphenyl, acrylonitrile, isoprene, and combinations thereof.

In certain embodiments disclosed herein, the polyimide (b) contains rigid rod-like groups that are capable of forming in-plane orientation when solution cast onto a substrate. The polymer film thus prepared exhibits negative out-of-plane birefringence and is commonly known as a negative C-plate for optical retardation compensation. Unlike un-substituted styrenic fluoropolymer, such as poly(α,β,β-trifluorostyrene), the nitrated styrenic fluoropolymer is miscible with polyimide in a solvent and the mixture can be made into a clear film of optical quality. Blending of the nitrated styrenic fluoropolymer with polyimide enables the wavelength dispersion curve of the styrenic fluoropolymer film to change from normal to reverse, which is highly desirable for achromatic broadband applications.

In embodiments disclosed herein, polyimides are prepared by reacting an aromatic dianhydride with an aromatic diamine. The aromatic dianhydride can be based on benzene (Formulae 2-5, below) or naphthalene (Formulae 6-7, below); the aromatic diamine can also be based on either benzene (Formulae 8 and 9, below) or naphthalene (Formulae 10 and 11, below). Polyimides suitable for this invention have been disclosed in U.S. Pat. Nos. 5,344,916, 5,480,964, 5,580,950, and 7,820,253, the contents of which are incorporated by reference herein in their entirety. Desirably, the polyimides are prepared by reacting one or more of the dianhydrides, such as pyromellitic dianhydride (PMDA) (2), 3,3',4,4'-biphenyltetracarboxylic dianhydride (BPDA) (3), 4,4'-(hexafluoroisopropylidene)diphthalic anhydride (6FDA) (4), 4,4'-(ethyne-1,2-diyl) diphthalic anhydride (EDDPA) (5), 4,4'-binaphthyl-1,1',8,8'-tetracarboxylic dianhydride (BNDA) (6), and 1,4,5,8-naphthalenetetracarboxylic dianhydride (NDA) (7), with one or more of the diamines, such as 2,4-diaminomesitylene (DAM) (8), 2,2'-bis(trifluoromethyl)benzidine (PFMB) (9), 1,5-naphthalenediamine (DAN) (10), [1,1'-binaphthalene]-5,5'-diamine (DABN) (11), 3,5-diethyl-toluene-2,6-diamine (2,6-DETDA) (12), 3,5-diethyl-toluene-2,4-diamine (2,4-

DETDA) (13), and 4,4'-(9-fluorenylidene)dianiline) (FRDA) (14). The most desirable dianhydrides are 6FDA (4), EDDPA (5), and BNDA (6), and the most desirable diamines are DAM (8), 2,6-DETDA (12), 2,4-DETDA (13), and FRDA (14). In one embodiment, the aromatic dianhydride is one or more selected from the group consisting of 6FDA (4), EDDPA (5), BNDA (6), and combinations thereof, and the aromatic diamine is one or more selected from the group consisting of DAM (8), 2,6-DETDA (12), 2,4-DETDA (13), FRDA (14), and combinations thereof. Various chemical compositions of dianhydrides and aromatic diamines are shown below:

2

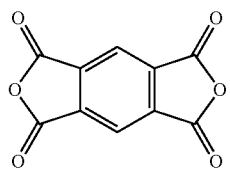

3

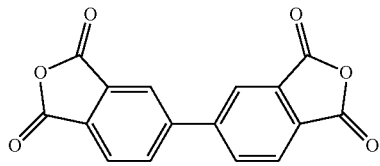

4

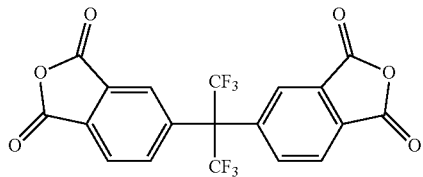

5

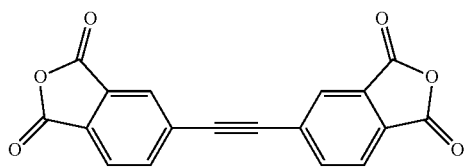

6

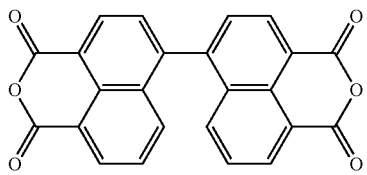

7

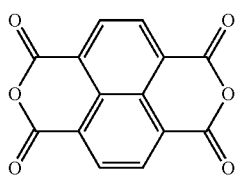

8

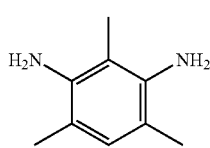

9

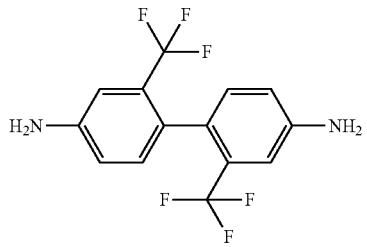

10

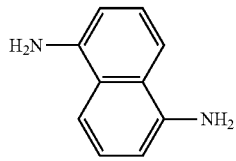

11

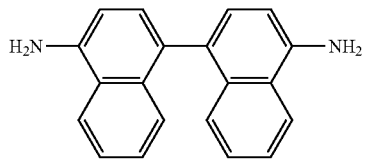

12

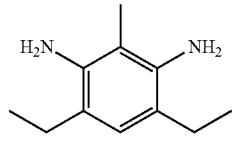

13

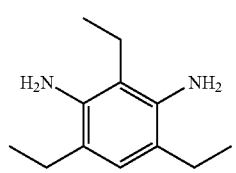

14

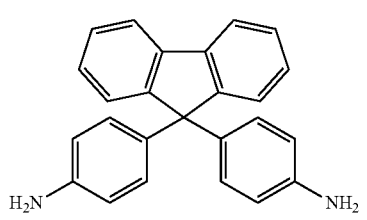

Other dianhydrides or diamines suitable for forming the polyimides used herein include those of Formulae 15 (5,5'-[1,4-phenylenebis(1,3,4-oxadiazole-5,2-diyl)]bis-1,3-isobenzofurandione), 16 (5,5'-(1,3,4-oxadiazole-2,5-diyl)bis-1,3-isobenzofurandione), 17 (4,4'-(1,4-phenylene)-bis(1,3,4-oxadiazole-2,5-diyl)di(o-toluidine)), 18 (4,4'-methylenebis(2,6-diethyl-aniline)), 19 (4,4'-(hexafluoroisopropylidene)dianiline), and 20 (4,4'-(hexafluoroisopropylidene)-bis(p-phenyleneoxy)dianiline). These additional dianhydrides and diamines are shown below:

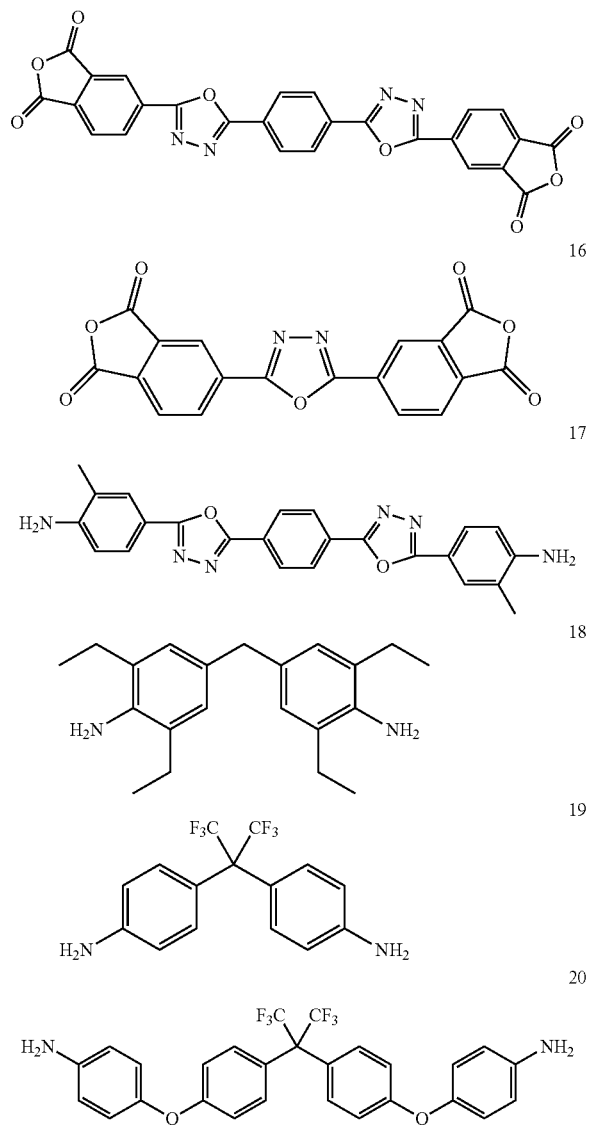

In further embodiments, the nitrated styrenic fluoropolymer (a) has an average degree of substitution (DS) ranging from about 0.6 to about 0.8 for the nitro group(s) on the styrenic ring and the polyimide (b) is the reaction product of components comprising:
i. 4,4'-(hexafluoroisopropylidene)-diphthalic anhydride (6FDA) in an amount from about 40 to about 60 molar percent, based on the total moles of (i) and (ii),
ii. 4,4'-binaphthyl-1,1',8,8'-tetracarboxylic dianhydride (BNDA) in an amount from about 40 to about 60 molar percent, based on the total moles of (i) and (ii),
iii. 2,4-diaminomesitylene (DAM) in an amount from about 60 to about 80 molar percent, based on the total moles of (iii) and (iv), and
iv. 4,4'-(9-fluorenylidene)dianiline) (FRDA) in an amount from about 20 to about 40 molar percent, based on the total moles of (iii) and (iv).

In another embodiment, the nitrated styrenic fluoropolymer (a) has an average degree of substitution (DS) ranging from about 0.6 to about 0.8 for the nitro group(s) on the styrenic ring and the polyimide (b) is the reaction product of components comprising:
i. 4,4'-(hexafluoroisopropylidene)-diphthalic anhydride (6FDA) in an amount from about 40 to about 60 molar percent, based on the total moles of (i) and (ii),
ii. 4,4'-binaphthyl-1,1',8,8'-tetracarboxylic dianhydride (BNDA) in an amount from about 40 to about 60 molar percent, based on the total moles of (i) and (ii), and
iii. 2,4-diaminomesitylene (DAM).

In yet another embodiment, the nitrated styrenic fluoropolymer (a) has an average degree of substitution (DS) ranging from about 0.6 to about 0.8 for the nitro group(s) on the styrenic ring and the polyimide (b) is the reaction product of components comprising:
i. 4,4'-(hexafluoroisopropylidene)-diphthalic anhydride (6FDA) in an amount from about 20 to about 40 molar percent, based on the total moles of (i) and (ii),
ii. 4,4'-(ethyne-1,2-diyl) diphthalic anhydride (EDDPA) in an amount from about 60 to about 80 molar percent, based on the total moles of (i) and (ii), and
iii. a mixture of 3,5-diethyl-toluene-2,6-diamine (2,6-DETDA) and 3,5-diethyl-toluene-2,4-diamine (2,4-DETDA).

In certain embodiments disclosed herein, the optical compensation film is prepared by casting from a solution blend comprising one or more of nitrated styrenic fluoropolymers and one or more of polyimides. The solution blend may be prepared by mixing the fluoropolymer solution and the polyimide solution, or it may be prepared by dissolving a mixture of powdery fluoropolymer and polyimide in a solvent. Suitable solvents include methyl ethyl ketone, cyclopentanone, toluene, methyl isobutyl ketone, methylene chloride, chloroform, 1,2-dichloroethane, methyl amyl ketone, methyl isopropyl ketone, methyl isoamyl ketone, ethyl acetate, n-butyl acetate, propylene glycol methyl ether acetate, and a mixture thereof. In another embodiment, the solution blend further comprises one or more additives that are capable of increasing the positive out-of-plane retardations of the optical compensation film of the invention and/or improving the desirable relations of $0.7<R(450)/R(550)<1$ and $1<R(650)/R(550)<1.25$, such as by facilitating the tuning or ease of control of the relations R(450)/R(550) and R(650)/R(550), both individually and relative to one another, with respect to the polymer blend and related films. Examples of the additives include, but are not limited to, IR absorbers, UV absorbers, and diimide compounds, which are prepared either by reacting a dianhydride with a monoamine or by reacting a diamine with a monoanhydride.

In one embodiment, the optical compensation film of the invention is prepared by being solution cast on a substrate. The casting of a polymer solution onto a substrate may be carried out by a method known in the art such as, for example, spin coating, spray coating, roll coating, curtain coating, or dip coating. Substrates are known in the art, which include triacetylcellulose (TAC), cyclic olefin polymer (COP), polyester, polyvinyl alcohol, cellulose ester, cellulose acetate propionate (CAP), polycarbonate, polyacrylate, polyolefin, polyurethane, polystyrene, glass, other materials commonly used in LCD devices, and still other materials commonly used in OLED display devices.

Preferably, the nitrated styrenic fluoropolymer component, when cast into film, has an out-of-plane birefringence ($\Delta n_{th}$) satisfying the equation of $\Delta n_{th}>0.02$ or $>0.025$ or $>0.03$, or $>0.035$. Higher birefringence materials have an advantage in that they can provide sufficient positive outof-plane retardations ($R_{th}$) as thin films to reduce or eliminate the negative $R_{th}$ exhibited in polyimide films.

When combined with an A-plate, the optical compensation film of this invention can eliminate the undesirable negative out-of-plane retardation present in the A-plate. Further, due to its reversed dispersion characteristics, the optical film of the invention can provide an achromatic compensation for optimal improvement of the viewing quality.

Further embodiments comprise the optical compensation film described in embodiments herein and an A-plate having a refractive index profile of $n_x > n_y = n_z$, wherein $n_x$ and $n_y$ represent in-plane refractive indices, and $n_z$ the thickness refractive index. In one embodiment, said A-plate is a quarter wave plate (QWP). In one embodiment, a QWP in combination with a linear polarizer functions as a circular polarizer. Such a circular polarizer can be used in an OLED display device to reduce the ambient light and thus improve the viewing quality.

The multilayer film of the present invention may be obtained by lamination, by solution casting, or by any other suitable means of creating a polymer film. In one embodiment, the solution of the polymer blend of the nitrated styrenic fluoropolymer (a) and the polyimide (b) is cast onto an A-plate to obtain a multilayer film.

Similarly, embodiments disclosed herein comprising films of the polymer blend of the nitrated styrenic fluoropolymer (a) and the polyimide (b) can also be combined with a B-plate having a refractive index profile of $n_x > n_y \neq n_z$. In one aspect, said B-plate is a biaxial quarter wave plate (QWP). In another embodiment, a biaxial QWP in combination with a linear polarizer functions as a circular polarizer. Such a circular polarizer can be used in an OLED display device to reduce the ambient light and thus improve the viewing quality.

The optical compensation film of the present invention may be used in a liquid crystal display device including an in-plane switching liquid crystal display device, in an OLED display device, in a 3D display device, in a circular polarizer, or in 3D glasses. Said display devices may be used for television, computer, mobile phone, camera, and other applications.

In additional embodiments of the present invention, a polymer resin is provided. The polymer resin has a moiety of:

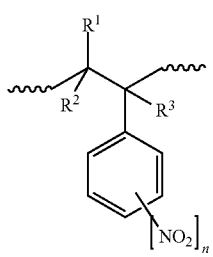

1 wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, and wherein n is an integer from 1 to 5 representing the number of the nitro group(s) on the styrenic ring.

In certain embodiments, the polymer resin comprises a mixture or copolymer of a styrenic fluoropolymer (above) and a polyimide.

In certain embodiments of the polymer resin, the DS for the nitro group is greater than 0.25. In certain embodiments the DS for the nitro group is greater than 0.4. In certain embodiments of the polymer resin, the DS for the nitro group is greater than 0.6. In certain embodiments of the polymer resin, the DS for the nitro group is greater than 0.8.

In one embodiment of the present invention, a polymer solution is provided. The polymer solution comprises a solvent and a polymer having a styrenic moiety of:

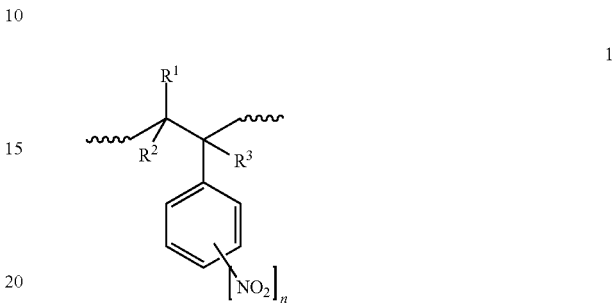

1 wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, and wherein n is an integer from 1 to 5 representing the number of the nitro group(s) on the styrenic ring.

In certain embodiments, the polymer in the polymer solution comprises a mixture or copolymer of a styrenic fluoropolymer (above) and a polyimide.

In certain embodiments of the polymer solution, the solvent is selected from the group consisting of: toluene, methyl isobutyl ketone, cyclopentanone, methylene chloride, 1,2-dichloroethane, methyl amyl ketone, methyl ethyl ketone, methyl isoamyl ketone, and mixtures thereof. In certain embodiments of the polymer solution, the solvent is selected from the group consisting of: methyl ethyl ketone, methylene chloride, cyclopentanone, and mixtures thereof.

In certain embodiments of the polymer solution, the DS for the nitro group is greater than 0.25. In certain embodiments of the polymer solution, the DS for the nitro group is greater than 0.4. In certain embodiments of the polymer solution, the DS for the nitro group is greater than 0.6. In certain embodiments of the polymer solution, the DS for the nitro group is greater than 0.8.

When any of the resins described herein is combined with a solvent described herein to form a solution and then solution-cast as a film, the film formed from the resin exhibits the properties in accordance with the other embodiments disclosed herein.

EXAMPLES

The following examples describe and demonstrate exemplary embodiments of the polymers, polymer solutions, polymer films, and methods described herein. The exemplary embodiments are provided solely for the purpose of illustration and are not to be construed as limitations of the present disclosure, as many variations thereof are possible without departing from the spirit and scope of the present disclosure.

Example 1: Synthesis of Nitrated Poly(α,β,β-trifluorostyrene) (N-PTFS 1) Having DS=0.68

Materials: Poly(α,β,β-trifluorostyrene) (PTFS) was an internal product with an intrinsic viscosity (IV) of 1.10 dL/g, used as received. Dichloromethane (DCM) was from Acros, purified by passing through $SiO_2$. $HNO_3$ was from Acros (68%-70%), used as received. H2SO4 was from Sigma Aldrich (95.0%-98.0%), used as received.

To a one-liter three-neck round-bottom flask equipped with nitrogen inlet/outlet and a mechanical stirrer was charged a solution of PTFS (IV, 1.10 dL/g) in dichloromethane (DCM) (200 g, 5 weight %). Separately, a mixed acid solution was prepared by adding concentrated sulfuric acid (31.18 g) to nitric acid (11.75 g). The flask was placed in a water bath at room temperature. To the stirred PTFS solution in the flask was added the mixed acid over a period of 10 minutes. The reaction mixture was allowed to react at room temperature for 23 hours and was subsequently quenched by adding deionized water/ice (500 ml). The water phase at the top was then decanted and the organic phase washed repeatedly with deionized water to remove the acids. The resulting organic layer was precipitated into methanol (about one liter) and ground in a high speed blender to yield a powder suspension. The powder was then filtered and washed repeatedly with water and methanol. The resulting product was dried at 80° C. under reduced pressure overnight. Intrinsic viscosity (IV) of the polymer was 1.20 dL/g, measured by a Cannon® auto capillary viscometer using N-methyl-2-pyrrolidone (NMP) as the solvent at 30° C. The degree of substitution (DS) of the nitro group in the product was determined to be 0.68 by elemental analysis (EA).

Example 2: Synthesis of Nitrated Poly($\alpha,\beta,\beta$-trifluorostyrene) (N-PTFS 2) Having DS=0.86

To a one-liter three-neck round-bottom flask equipped with nitrogen inlet/outlet and a mechanical stirrer was charged a solution of PTFS (IV, 1.10 dL/g) in dichloromethane (DCM) (322 g, 5 weight %). Separately, a mixed acid solution was prepared by adding concentrated sulfuric acid (70.60 g) to nitric acid (27.81 g). The flask was placed in a water bath at room temperature. To the stirred PTFS solution in the flask was added the mixed acid over a period of 10 minutes. The reaction mixture was allowed to react at room temperature for 21 hours and subsequently quenched by adding deionized water/ice (800 ml). The water phase at the top was then decanted and the organic phase washed repeatedly with deionized water to remove the acids. The resulting organic layer was precipitated into methanol (about 1.5 liters) and ground in a high speed blender to yield a powder suspension. The powder was then filtered and washed repeatedly with water and methanol. The resulting product was dried at 80° C. under reduced pressure overnight. Intrinsic viscosity (IV) of the polymer was 1.20 dL/g, measured by a Cannon® auto capillary viscometer using N-methyl-2-pyrrolidone (NMP) as the solvent at 30° C. The degree of substitution (DS) of the nitro group in the product was determined to be 0.86 by elemental analysis (EA).

Example 3: Synthesis of Polyimide 1 (6FDA/BNDA/DAM, 50/50/100)

DAM-BNDA-DAM diamine was prepared by reacting 4,4'-binaphthyl-1,1',8,8'-tetracarboxylic dianhydride (BNDA) with an excess of 2,4-diaminomesitylene (DAM) (molar ratio DAM/BNDA>2.5) in m-cresol at 180° C. for 18 hours. The reaction solution was precipitated into an excess of methanol to yield a powder product. The product was then filtered and washed repeatedly with methanol. The resulting product was dried at 80° C. under reduced pressure overnight and ready for the next step polymerization.

To a 100 ml three-neck round-bottom flask equipped with nitrogen inlet/outlet and a mechanical stirrer were charged N,N-dimethylacetamide (DMAc) (22 ml), DAM-BNDA-DAM (3.2945 g, 5.00 mmol) and 4,4'-(hexafluoroisopropylidene)diphthalic anhydride (6FDA) (2.1790 g, 4.91 mmol). The reaction mixture was allowed to react at room temperature for 18 hours, followed by the addition of pyridine (1.0 ml) and acetic anhydride (2.5 ml). The reaction was allowed to continue at 120° C. for two hours. After cooling down, the resulting solution was precipitated into methanol (about 100 ml) to yield a fibrous product. The product was then filtered and washed repeatedly with methanol. The resulting product was dried at 80° C. under reduced pressure overnight. Intrinsic viscosity (IV) of the polymer was 1.07 dL/g, measured by a Cannon® auto capillary viscometer using N-methyl-2-pyrrolidone (NMP) as the solvent at 30° C.

Example 4: Preparation of Polymer Films Cast from Blends of N-PTFS and Polyimide 1 (6FDA/BNDA/DAM, 50/50/100)

Polymer films were prepared by using N-PTFS 1 and N-PTFS 2 respectively and polyimide 1 (6FDA/BNDA/DAM, 50/50/100) at various ratios. A 10 wt. % solution of N-PTFS was prepared by dissolving N-PTFS solid in cyclopentanone. Separately, a 10 wt. % solution of polyimide 1 was prepared in cyclopentanone. The polymer blend solutions were then prepared by mixing the two solutions at various ratios by weight as listed in Table 1, below. The prepared homogenous and clear blend solutions were applied to flat glass substrates using the blade casting method. The coating films were allowed to dry in air overnight and subsequently placed in a vacuum oven at 80° C.-150° C. for 2 hours. After drying, the films were peeled off. The films were clear.

Example 5: Properties of Polymer Films Cast from Blends of N-PTFS and Polyimide 1 (6FDA/BNDA/DAM, 50/50/100)

Birefringence and thickness of the free standing films were measured by the Metricon Model 2010/M Prism Coupler using single film mode at a wavelength of 633 nm. The retardation and the dispersion were determined by the J. A. Woollam M-2000 or RC2 Ellipsometry. The birefringence at 633 nm, the thickness, and the dispersion factors R(450)/R (550) and R(650)/R(550) are listed in Table 1.

TABLE 1

N-PTFS/Polyimide 1 Blend Films

| ID | N-PTFS | Polyimide (PI) | N-PTFS/PI weight ratio | $\Delta n^{633\,nm}$ | Thickness μm | R(450)/R(550) | R(650)/R(550) |
|---|---|---|---|---|---|---|---|
| Film 1 | DS = 0.68 | Polyimide 1 | 80.3/19.7 | 0.0137 | 15 | 0.939 | 1.002 |
| Film 2 | | 6FDA/BNDA/DAM | 77.6/22.4 | 0.0122 | 17 | 0.890 | 1.014 |
| Film 3 | | (50/50/100) | 75.6/24.4 | 0.0101 | 15 | 0.858 | 1.027 |
| Film 4 | | | 73.6/26.4 | 0.0088 | 14 | 0.801 | 1.040 |
| Film 5 | | | 71.6/28.4 | 0.0076 | 16 | 0.738 | 1.060 |
| Film 6 | | | 69.2/30.8 | 0.0060 | 15 | 0.592 | 1.108 |
| Film 7 | DS = 0.86 | | 80.0/20.0 | 0.0169 | 14 | 0.959 | 0.994 |
| Film 8 | | | 77.9/22.1 | 0.0149 | 14 | 0.932 | 1.001 |
| Film 9 | | | 75.3/24.7 | 0.0127 | 15 | 0.874 | 1.019 |
| Film 10 | | | 74.0/26.0 | 0.0115 | 15 | 0.843 | 1.024 |
| Film 11 | | | 70.9/29.1 | 0.0095 | 15 | 0.753 | 1.050 |
| Film 12 | | | 68.5/31.5 | 0.0078 | 15 | 0.666 | 1.075 |

Example 6: Synthesis of Polyimide 2 (6FDA/EDDPA/DAM, 50/50/100)

To a 100 ml three-neck round-bottom flask equipped with nitrogen inlet/outlet and a mechanical stirrer were charged DMAc (24 ml), DAM (1.5037 g, 10.01 mmol), 4,4'-(ethyne-1,2-diyl) diphthalic anhydride (EDDPA) (1.5926 g, 5.00 mmol), and 6FDA (2.2285 g, 5.02 mmol). The reaction mixture was allowed to react at room temperature for 18 hours, followed by the addition of pyridine (2.0 ml) and acetic anhydride (5.0 ml). The reaction was allowed to continue at 120° C. for two hours. After cooling down, the resulting solution was precipitated into methanol (about 100 ml) to yield a fibrous product. The product was then filtered and washed repeatedly with methanol. The resulting product was dried at 80° C. under reduced pressure overnight. Intrinsic viscosity (IV) of the polymer was 1.35 dL/g, measured by a Cannon® auto capillary viscometer using N-methyl-2-pyrrolidone (NMP) as the solvent at 30° C.

Example 7: Preparation of Polymer Films Cast from Blends of N-PTFS and Polyimide 2 (6FDA/EDDPA/DAM)

Polymer films were prepared by using N-PTFS 1 and N-PTFS 2 respectively and polyimide 2 (6FDA/EDDPA/DAM, 50/50/100) at various ratios. A 10 wt. % solution of N-PTFS was prepared by dissolving N-PTFS solid in cyclopentanone. Separately a 10 wt. % solution of polyimide 2 was prepared in cyclopentanone. The polymer blend solutions were then prepared by mixing the two solutions at various ratios as listed in table 2. The prepared homogenous and clear blend solutions were applied to flat glass substrates using the blade casting method. The coating films were allowed to dry in air overnight and subsequently placed in a vacuum oven at 80° C.-150° C. for 2 hours. After drying, the films were peeled off. The films were clear.

Example 8: Properties of Polymer Films Cast from Blends of N-PTFS and Polyimide 2 (6FDA/EDDPA/DAM, 50/50/100)

Birefringence and thickness of the free standing films were measured by the Metricon Model 2010/M Prism Coupler using single film mode at a wavelength of 633 nm. The retardation and the dispersion were determined by the J. A. Woollam M-2000 or RC Ellipsometry. The birefringence at 633 nm, the thickness, the dispersion factors R(450)/R(550) and R(650)/R(550) are listed in Table 2.

TABLE 2

N-PTFS/Polyimide 2 Blend Films

| ID | N-PTFS | Polyimide (PI) | N-PTFS/PI weight ratio | $\Delta n^{633\,nm}$ | Thickness μm | R(450)/R(550) | R(650)/R(550) |
|---|---|---|---|---|---|---|---|
| Film 13 | DS = 0.68 | Polyimide 2 | 84.1/15.9 | 0.0185 | 9.3 | 1.013 | 0.988 |
| Film 14 | | 6FDA/EDDPA/DAM | 79.8/20.2 | 0.0160 | 9.2 | 0.958 | 1.001 |
| Film 15 | | (50/50/100) | 78.2/21.9 | 0.0131 | 9.1 | 0.955 | 1.004 |
| Film 16 | | | 76.0/24.0 | 0.0114 | 9.2 | 0.919 | 1.013 |
| Film 17 | | | 74.3/25.7 | 0.0099 | 9.2 | 0.895 | 1.017 |
| Film 18 | | | 72.2/27.8 | 0.0077 | 9.3 | 0.828 | 1.032 |
| Film 19 | | | 69.9/30.1 | 0.0063 | 9.5 | 0.722 | 1.076 |
| Film 20 | | | 68.2/31.8 | 0.0047 | 9.8 | 0.616 | 1.101 |
| Film 21 | DS = 0.86 | | 83.8/16.2 | 0.0192 | 9.1 | 1.021 | 0.979 |
| Film 22 | | | 80.0/20.0 | 0.0162 | 9.1 | 1.001 | 0.988 |
| Film 23 | | | 78.2/21.8 | 0.0147 | 9.2 | 0.973 | 1.000 |
| Film 24 | | | 75.9/24.1 | 0.0127 | 9.1 | 0.945 | 1.007 |
| Film 25 | | | 73.7/26.3 | 0.0108 | 7.7 | 0.913 | 1.010 |
| Film 26 | | | 72.2/27.8 | 0.0094 | 10.2 | 0.874 | 1.030 |
| Film 27 | | | 70.0/30.0 | 0.0076 | 10.1 | 0.803 | 1.039 |
| Film 28 | | | 67.8/32.2 | 0.0057 | 9.7 | 0.708 | 1.069 |

Example 9: Synthesis of Nitrated Poly(α,β,β-trifluorostyrene) (N-PTFS 3) Having DS=0.72

Poly(α,β,β-trifluorostyrene) (PTFS; IV, 1.10 dL/g) (1.2 kg) was mixed with 1,2-dichloroethane (13.8 kg) in a 19 L reactor under nitrogen. The mixture was heated to 50° C. with agitation. Once all solids dissolved, the mixture was further heated to 55° C., upon which a pre-made mixture of sulfuric acid (98%, 2.89 kg) and nitric acid (69%, 1.12 kg) was added in 2.5 hours. The mixture was then heated to 60° C. and held for 4 hours. Propionic acid (13.3 kg) was added to precipitate the product while the mixture was being cooled to room temperature. The resulting suspension was filtered, and the crude powder product was washed first with propionic acid twice and then with methanol repeatedly. The resulting product was dried at 60° C. under reduced pressure to give 1.3 kg powder product. The degree of substitution (DS) of the nitro group in the product was determined to be 0.72 by elemental analysis (EA).

Example 10: Synthesis of Polyimide 3 (6FDA/BNDA/DAM/FRDA, 50/50/70/30)

DAM-BNDA-DAM diamine was prepared by reacting 4,4'-binaphthyl-1,1',8,8'-tetracarboxylic dianhydride (BNDA) with an excess of 2,4-diaminomesitylene (DAM) (molar ratio DAM/BNDA>2.5) in m-cresol at 180° C. for 18 hours. The reaction solution was precipitated into an excess of methanol to yield a powder product. The product was then filtered and washed repeatedly with methanol. The resulting product was dried at 80° C. under reduced pressure overnight and ready for the next step polymerization.

FRDA-BNDA-FRDA diamine was prepared by reacting 4,4'-binaphthyl-1,1',8,8'-tetracarboxylic dianhydride (BNDA) with an excess of 4,4'-(9-fluorenylidene)dianiline (FRDA) (molar ratio FRDA/BNDA>2.5) in m-cresol at 180° C. for 18 hours. The reaction solution was precipitated into an excess of methanol to yield a powder product. The product was then filtered and washed repeatedly with methanol. The resulting product was dried at 80° C. under reduced pressure overnight and ready for the next step polymerization.

To a 100 ml three-neck round-bottom flask equipped with nitrogen inlet/outlet and a mechanical stirrer were charged N,N-dimethylacetamide (DMAc) (20 ml), DAM-BNDA-DAM (1.845 g, 2.80 mmol), FRDA-BNDA-FRDA (1.266 g, 1.20 mmol) and 4,4'-(hexafluoroisopropylidene)diphthalic anhydride (6FDA) (1.777 g, 4.00 mmol). The reaction mixture was allowed to react at room temperature for 18 hours, followed by the addition of pyridine (1.0 ml) and acetic anhydride (2.5 ml). The reaction was allowed to continue at 120° C. for two hours. After cooling down, the resulting solution was precipitated into methanol (about 100 ml) to yield a fibrous product. The product was then filtered and washed repeatedly with methanol. The resulting product was dried at 80° C. under reduced pressure overnight. Intrinsic viscosity (IV) of the polymer was 0.49 dL/g, measured by a Cannon® auto capillary viscometer using N-methyl-2-pyrrolidone (NMP) as the solvent at 30° C.

Example 11: Preparation of Polymer Films Cast from Blends of N-PTFS and Polyimide 3 (6FDA/BNDA/DAM/FRDA, 50/50/70/30)

Polymer films were prepared by using N-PTFS 3 (DS=0.72) and polyimide 3 (6FDA/BNDA/DAM/FRDA, 50/50/70/30) at various ratios. A 10 wt. % solution of N-PTFS was prepared by dissolving N-PTFS solid in cyclopentanone. Separately, a 10 wt. % solution of polyimide 3 was prepared in cyclopentanone. The polymer blend solutions were then prepared by mixing the two solutions at various ratios as listed in Table 3. The prepared homogenous and clear blend solutions were applied to flat glass substrates using the blade casting method. The coating films were allowed to dry in air overnight and subsequently placed in a vacuum oven at 80° C.–150° C. for 2 hours. After drying, the films were peeled off. The films were clear.

Example 12: Properties of Polymer Films Cast from Blends of N-PTFS and Polyimide 3 (6FDA/BNDA/DAM/FRDA, 50/50/70/30)

Birefringence and thickness of the free standing films were measured by the Metricon Model 2010/M Prism Coupler using single film mode at a wavelength of 633 nm. The retardation and the dispersion were determined by the J. A. Woollam RC2 Ellipsometry. The birefringence at 633 nm, the thickness, and the dispersion factors R(450)/R(550) and R(650)/R(550) are listed in Table 3.

TABLE 3

N-PTFS/Polyimide 3 Blend Films

| ID | N-PTFS | Polyimide (PI) | N-PTFS/PI weight ratio | $\Delta n^{633\ nm}$ | Thickness μm | R(450)/R(550) | R(650)/R(550) |
|---|---|---|---|---|---|---|---|
| Film 29 | DS = 0.72 | Polyimide 3 | 83.9/16.1 | 0.0196 | 9.0 | 1.01 | 0.98 |
| Film 30 | | 6FDA/BNDA/DAM/FRDA | 81.9/18.1 | 0.0179 | 8.8 | 0.99 | 0.98 |
| Film 31 | | (50/50/70/30) | 79.6/20.4 | 0.0161 | 9.6 | 0.96 | 0.99 |
| Film 32 | | | 77.8/22.2 | 0.0150 | 9.2 | 0.95 | 1.00 |
| Film 33 | | | 75.9/24.1 | 0.0138 | 9.1 | 0.91 | 1.00 |
| Film 34 | | | 73.9/26.1 | 0.0124 | 9.1 | 0.88 | 1.02 |
| Film 35 | | | 72.0/28.0 | 0.0112 | 9.5 | 0.84 | 1.02 |
| Film 36 | | | 70.0/30.0 | 0.0095 | 9.0 | 0.77 | 1.04 |
| Film 37 | | | 67.9/32.1 | 0.0081 | 9.7 | 0.70 | 1.05 |
| Film 38 | | | 66.0/34.0 | 0.0069 | 9.8 | 0.57 | 1.09 |
| Film 39 | | | 0/100 | −0.0297 | 11.6 | 1.34 | 0.90 |

Example 13: Synthesis of Polyimide 4 (6FDA/EDDPA/DETDA, 30/70/100)

To a 5000 ml three-neck round-bottom flask equipped with nitrogen inlet/outlet and a mechanical stirrer were charged N,N-dimethylacetamide (DMAc) (1524 g), DETDA (169.1 g, 950 mmol), EDDPA (211.3 g, 665 mmol) and 4,4'-(hexafluoroisopropylidene)diphthalic anhydride (6FDA) (126.4 g, 285 mmol). The reaction mixture was allowed to react at room temperature for 18 hours, followed by the addition of pyridine and acetic anhydride. The reaction was allowed to continue at 120° C. for two hours. After cooling down, the resulting solution was blended with methanol (5 times volume) to yield a polymer product. The product was then filtered and washed repeatedly with methanol. The resulting product was dried at 80° C. under reduced pressure overnight. Intrinsic viscosity (IV) of the polymer was 0.88 dL/g, measured by a Cannon® auto capillary viscometer using N-methyl-2-pyrrolidone (NMP) as the solvent at 30° C.

Example 14: Preparation of Polymer Films Cast from Blends of N-PTFS and Polyimide 4 (6FDA/EDDPA/DETDA, 30/70/100)

Polymer films were prepared by using N-PTFS 3 (DS=0.72) and polyimide 4 (6FDA/EDDPA/DETDA, 30/70/100) at various ratios. A 10 wt. % solution of N-PTFS was prepared by dissolving N-PTFS solid in cyclopentanone. Separately, a 10 wt. % solution of polyimide 4 was prepared in cyclopentanone. The polymer blend solutions were then prepared by mixing the two solutions at various ratios as listed in Table 4. The prepared homogenous and clear blend solutions were applied to flat glass substrates using the blade casting method. The coating films were allowed to dry in air overnight and subsequently placed in a vacuum oven at 80° C.-150° C. for 2 hours. After drying, the films were peeled off. The films were clear.

Example 15: Properties of Polymer Films Cast from Blends of N-PTFS and Polyimide 4 (6FDA/EDDPA/DETDA, 30/70/100)

Birefringence and thickness of the free standing films were measured by the Metricon Model 2010/M Prism Coupler using single film mode at a wavelength of 633 nm. The retardation and the dispersion were determined by the J. A. Woollam RC2 Ellipsometry. The birefringence at 633 nm, the thickness, and the dispersion factors R(450)/R(550) and R(650)/R(550) are listed in Table 4.

650 nm respectively and wherein the nitrated styrenic fluoropolymer has a styrenic moiety of:

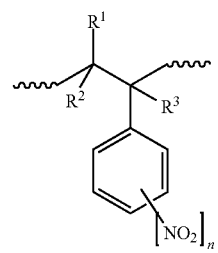

wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, and wherein n is an integer from 1 to 5 representing the number of the nitro group(s) on the styrenic ring.

2. The optical compensation film of claim 1, wherein the positive out-of-plane retardations satisfy the relations of 0.8<R(450)/R(550)<0.9 and 1.01<R(650)/R(550)<1.2.

3. The optical compensation film of claim 1, wherein the nitrated styrenic fluoropolymer (a) is from about 60% to about 90% and the polyimide (b) is from about 10% to about 40%, based on the total weight of (a) and (b).

4. The optical compensation film of claim 1, wherein the nitrated styrenic fluoropolymer (a) is from about 70% to about 80% and the polyimide (b) is from about 20% to about 30%, based on the total weight of (a) and (b).

5. The optical compensation film of claim 1, wherein the nitrated styrenic fluoropolymer has an average degree of substitution ranging from about 0.2 to about 1 for the nitro group(s) on the styrenic ring.

6. The optical compensation film of claim 1, wherein the nitrated styrenic fluoropolymer has an average degree of substitution ranging from about 0.5 to about 0.9 for the nitro group(s) on the styrenic ring.

7. The optical compensation film of claim 1, wherein the nitrated styrenic fluoropolymer is poly($\alpha,\beta,\beta$-trifluorostyrene).

TABLE 4

N-PTFS/Polyimide 4 Blend Films

| ID | N-PTFS | Polyimide (PI) | N-PTFS/PI weight ratio | $\Delta n^{633\ nm}$ | Thickness μm | R(450)/ R(550) | R(650)/ R(450) |
|---|---|---|---|---|---|---|---|
| Film 40 | DS = 0.72 | Polyimide 4 | 86.4/13.6 | 0.0182 | 8.5 | 1.01 | 0.96 |
| Film 41 | | 6FDA/EDDPA/DETDA | 80.4/19.6 | 0.0124 | 9.1 | 0.94 | 0.98 |
| Film 42 | | 30/70/100 | 77.9/22.1 | 0.0101 | 8.8 | 0.88 | 1.00 |
| Film 43 | | | 75.9/24.1 | 0.0084 | 8.9 | 0.83 | 1.04 |
| Film 44 | | | 0/100 | −0.0437 | 11.1 | 1.24 | 0.90 |

The invention claimed is:

1. An optical compensation film, which is made by solution casting of a polymer blend comprising:
(a) a nitrated styrenic fluoropolymer and
(b) a polyimide,
wherein said optical compensation film has positive out-of-plane retardations that satisfy the relations of 0.7<R(450)/R(550)<1 and 1<R(650)/R(550)<1.25, wherein R(450), R(550), and R(650) are out-of-plane retardations at the light wavelengths of 450 nm, 550 nm, and 8. The optical compensation film of claim 1, wherein the polyimide is a reaction product of components comprising an aromatic dianhydride and an aromatic diamine.

9. The optical compensation film of claim 8, wherein the aromatic dianhydride is selected from the group consisting of pyromellitic dianhydride (PMDA) (2), 3,3',4,4'-biphenyltetracarboxylic dianhydride (BPDA) (3), 4,4'-(hexafluoroisopropylidene)diphthalic anhydride (6FDA) (4), 4,4'-(ethyne-1,2-diyl) diphthalic anhydride (EDDPA) (5), 4,4'-binaphthyl-1,1',8,8'-tetracarboxylic dianhydride (BNDA)

(6), 1,4,5,8-naphthalenetetracarboxylic dianhydride (NDA) (7), represented by the following formulas (2) to (7) below

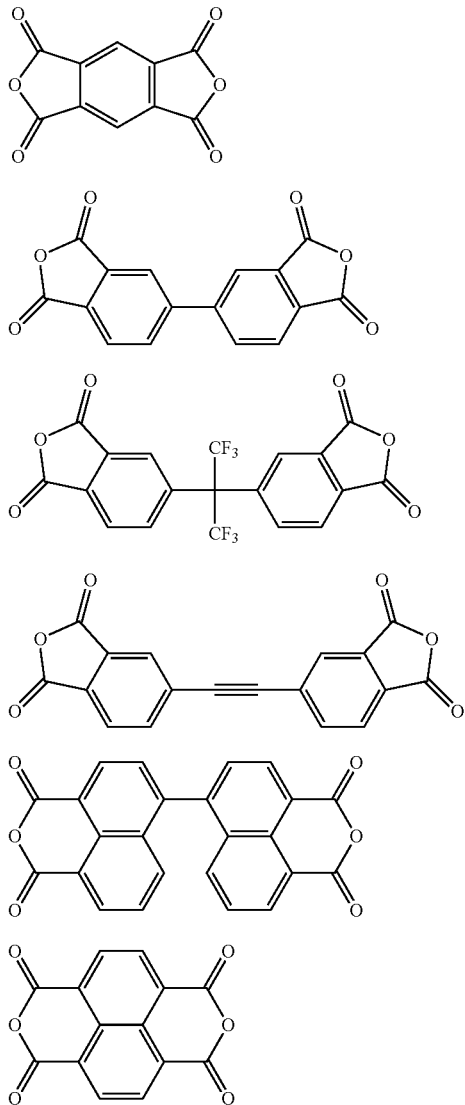

and combinations thereof.

10. The optical compensation film of claim 8, wherein the aromatic diamine is selected from the group consisting of 2,4-diaminomesitylene (DAM) (8), 2,2'-bis(trifluoromethyl)benzidine (PFMB) (9), 1,5-naphthalenediamine (DAN) (10), and [1,1'-binaphthalene]-5,5'-diamine (DABN) (11), 3,5-diethyl-toluene-2,6-diamine (2,6-DETDA) (12), 3,5-diethyl-toluene-2,4-diamine (2,4-DETDA) (13), 4,4'-(9-fluorenylidene)dianiline) (FRDA) (14), represented by the following formulas (8) to (14) below

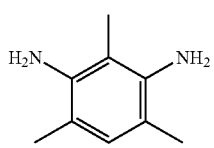

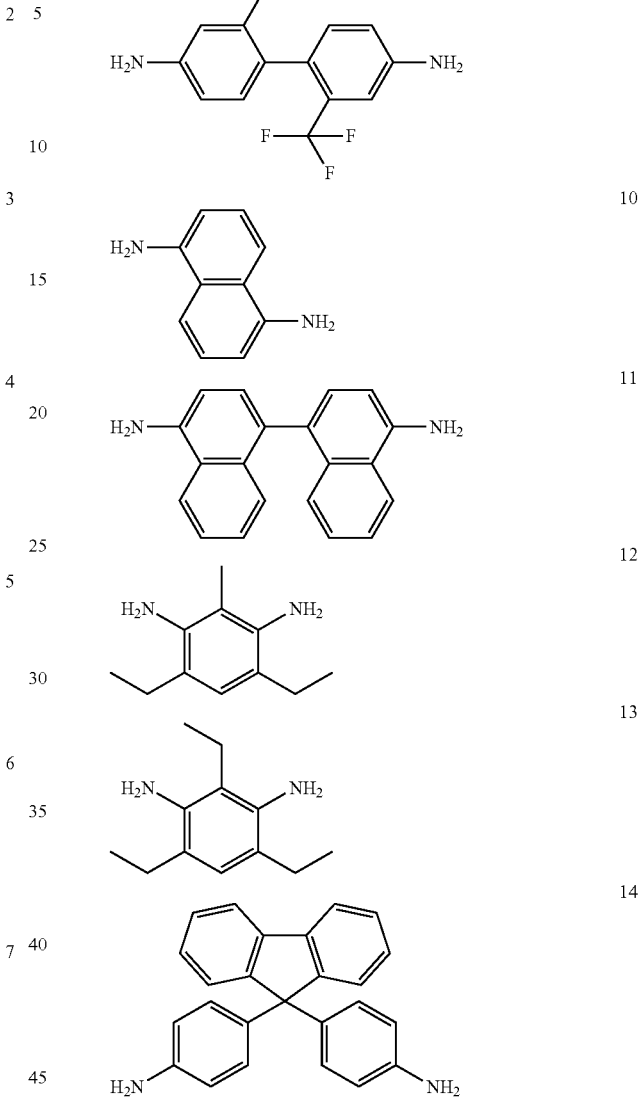

and combinations thereof.

11. The optical compensation film of claim 8, wherein the aromatic dianhydride is selected from the group consisting of 4,4'-(hexafluoroisopropylidene)diphthalic anhydride (6FDA), 4,4'-(ethyne-1,2-diyl) diphthalic anhydride (ED-DPA), 4,4'-binaphthyl-1,1',8,8'-tetracarboxylic dianhydride (BNDA), and combinations thereof.

12. The optical compensation film of claim 8, wherein the aromatic diamine is selected from the group consisting of 2,4-diaminomesitylene (DAM), 3,5-diethyl-toluene-2,6-diamine (2,6-DETDA), 3,5-diethyl-toluene-2,4-diamine (2,4-DETDA), and 4,4'-(9-fluorenylidene)dianiline (FRDA), and combinations thereof.

13. The optical compensation film of claim 8, wherein the aromatic dianhydride is selected from the group consisting of 4,4'-(hexafluoroisopropylidene)diphthalic anhydride (6FDA), 4,4'-(ethyne-1,2-diyl) diphthalic anhydride (ED-DPA), 4,4'-binaphthyl-1,1',8,8'-tetracarboxylic dianhydride (BNDA), and combinations thereof, and the aromatic diamine is one or more selected from the group consisting of 2,4-diaminomesitylene (DAM), 3,5-diethyl-toluene-2,6-diamine (2,6-DETDA), 3,5-diethyl-toluene-2,4-diamine (2,4-DETDA), 4,4'-(9-fluorenylidene)dianiline (FRDA), and combinations thereof.

14. The optical compensation film of claim 1, wherein the nitrated styrenic fluoropolymer (a) has an average degree of substitution ranging from about 0.6 to about 0.8 for the nitro group(s) on the styrenic ring and the polyimide (b) is the reaction product of components comprising:
   (i) 4,4'-(hexafluoroisopropylidene)-diphthalic anhydride (6FDA) in an amount from about 40 to about 60 molar percent and
   (ii) 4,4'-binaphthyl-1,1',8,8'-tetracarboxylic dianhydride (BNDA) in an amount from about 40 to about 60 molar percent, based on the total moles of (i) and (ii); and
   (iii) 2,4-diaminomesitylene (DAM) in an amount from about 60 to about 80 molar percent and
   (iv) 4,4'-(9-fluorenylidene)dianiline (FRDA) in an amount from about 20 to about 40 molar percent, based on the total moles of (iii) and (iv).

15. The optical compensation film of claim 1, wherein the nitrated styrenic fluoropolymer (a) has an average degree of substitution ranging from about 0.6 to about 0.8 for the nitro group(s) on the styrenic ring and the polyimide (b) is the reaction product of components comprising:
   (i) 4,4'-(hexafluoroisopropylidene)-diphthalic anhydride (6FDA) in an amount from about 40 to about 60 molar percent and
   (ii) 4,4'-binaphthyl-1,1',8,8'-tetracarboxylic dianhydride (BNDA) in an amount from about 40 to about 60 molar percent, based on the total moles of (i) and (ii); and
   (iii) 2,4-diaminomesitylene (DAM).

16. The optical compensation film of claim 1, wherein the nitrated styrenic fluoropolymer (a) has an average degree of substitution ranging from about 0.6 to about 0.8 for the nitro group(s) on the styrenic ring and the polyimide (b) is the reaction product of components comprising
   (i) 4,4'-(hexafluoroisopropylidene)-diphthalic anhydride (6FDA) in an amount from about 20 to about 40 molar percent and
   (ii) 4,4'-(ethyne-1,2-diyl) diphthalic anhydride (EDDPA) in an amount from about 60 to about 80 molar percent, based on the total moles of (i) and (ii); and
   (iii) a mixture of 3,5-diethyl-toluene-2,6-diamine (2,6-DETDA) and 3,5-diethyl-toluene-2,4-diamine (2,4-DETDA).

17. The optical compensation film of claim 1, wherein the film has a positive out-of-plane retardation from about 100 nm to about 150 nm at the wavelength ($\lambda$) of 550 nm and a film thickness from about 5 micron ($\mu$m) to about 20 micron ($\mu$m).

18. A multilayer optical film comprising the optical compensation film of claim 1 and an A-plate having a refractive index profile of $n_x > n_y = n_z$, wherein $n_x$ and $n_y$ represent in-plane refractive indices, and $n_z$ the thickness refractive index.

19. The multilayer optical film of claim 18, wherein the A-plate is a quarter wave plate (QWP).

20. A multilayer optical film comprising the optical compensation film of claim 1 and a B-plate having a refractive index profile of $n_x > n_y \neq n_z$, wherein $n_x$ and $n_y$ represent in-plane refractive indices, and $n_z$ the thickness refractive index.

21. The multilayer optical film of claim 20, wherein the B-plate is a quarter wave plate (QWP).

22. A circular polarizer comprising the optical compensation film of claim 1.

23. A liquid crystal display comprising the optical compensation film of claim 1.

24. An OLED display comprising the optical compensation film of claim 1.

* * * * *